(12) United States Patent
Henry et al.

(10) Patent No.: US 7,470,989 B2
(45) Date of Patent: Dec. 30, 2008

(54) TECHNIQUE FOR PERFECTING THE ACTIVE REGIONS OF WIDE BANDGAP SEMICONDUCTOR NITRIDE DEVICES

(75) Inventors: Richard L Henry, Great Falls, VA (US); Martin C Peckerar, Silver Spring, MD (US); Daniel D Koleske, Albuquerque, NM (US); Alma E Wickenden, Woodbine, MD (US); Charles R Eddy, Jr., Columbia, MD (US); Ronald T Holm, Alexandria, VA (US); Mark E Twigg, Falls Church, VA (US)

(73) Assignee: The United States of America as represented by The Secretary of the Navy, Washington, DC (US)

( * ) Notice: Subject to any disclaimer, the term of this patent is extended or adjusted under 35 U.S.C. 154(b) by 151 days.

(21) Appl. No.: 11/461,904

(22) Filed: Aug. 2, 2006

(65) Prior Publication Data
US 2007/0004106 A1    Jan. 4, 2007

Related U.S. Application Data

(62) Division of application No. 10/768,747, filed on Jan. 23, 2004, now Pat. No. 7,198,970.

(51) Int. Cl.
*H01L 23/48* (2006.01)
*H01L 23/52* (2006.01)
*H01L 29/40* (2006.01)

(52) U.S. Cl. .................. 257/760; 257/758; 438/638; 438/639

(58) Field of Classification Search .......... 257/758, 257/760; 438/638, 639
See application file for complete search history.

(56) References Cited

U.S. PATENT DOCUMENTS

| 3,683,240 | A | 8/1972 | Pankove |
| 3,864,592 | A | 2/1975 | Pankove |
| 4,637,127 | A | 1/1987 | Kurogi et al. |
| 4,971,928 | A | 11/1990 | Fuller |
| 5,006,914 | A | 4/1991 | Beetz, Jr. |
| 5,093,576 | A | 3/1992 | Edmond et al. |
| 5,543,629 | A | 8/1996 | Nakamura et al. |
| 5,741,360 | A | 4/1998 | Goto et al. |

(Continued)

OTHER PUBLICATIONS

Davis et al., "Gallium Nitride Materials-Progress, Status, and Potential Roadblocks," Jun. 2002, IEEE, pp. 993-1004.

(Continued)

*Primary Examiner*—Fernando L Toledo
(74) *Attorney, Agent, or Firm*—John J. Karasek; Stephen T. Hunnius

(57) ABSTRACT

This invention pertains to electronic/optoelectronic devices with reduced extended defects and to a method for making it. The device includes a substrate, a semiconductor active material deposited on said substrate, and electrical contacts. The semiconductor active material defines raised structures having atomically smooth surfaces. The method includes the steps of depositing a dielectric thin film mask material on a semiconductor substrate surface; patterning the mask material to form openings therein extending to the substrate surface; growing active material in the openings; removing the mask material to form the device with reduced extended defect density; and depositing electrical contacts on the device.

18 Claims, 5 Drawing Sheets

U.S. PATENT DOCUMENTS

| | | | |
|---|---|---|---|
| 5,796,902 | A | 8/1998 | Bhat et al. |
| 5,847,418 | A | 12/1998 | Nakamura et al. |
| 6,051,849 | A * | 4/2000 | Davis et al. ............... 257/103 |
| 6,177,359 | B1 | 1/2001 | Chen et al. |
| 6,177,688 | B1 | 1/2001 | Linthicum et al. |
| 6,812,053 | B1 | 11/2004 | Kong et al. |
| 6,900,070 | B2 | 5/2005 | Craven et al. |
| 2004/0119076 | A1 * | 6/2004 | Ryu ............................ 257/77 |
| 2005/0164475 | A1 | 7/2005 | Peckerar et al. |

OTHER PUBLICATIONS

Zheleva et al., "Dislocation density reduction via lateral epitaxy in selectively grown GaN structures," Oct. 1997, Appl. Phys. Lett., pp. 2472-2474/.

Twigg et al., A Model for the Critical Height for Dislocation Annihilation and Recombination in GaN Columns Deposited by Patterned Growth, 2005, Mater. Res. Soc. Symp. Proc., vol. 83, at E11.29.1 to E11.29.8.

* cited by examiner

TECHNIQUE FOR PERFECTING THE ACTIVE REGIONS OF WIDE BANDGAP SEMICONDUCTOR NITRIDE DEVICES

BACKGROUND OF THE INVENTION

1. Field of the Invention

This invention pertains to wide bandgap electronic devices, such as high frequency and high power devices; optoelectronic devices, such as visible light emitters to ultraviolet lasers and detectors; and a method for making such devices.

2. Description of Related Art

Wide bandgap semiconductor nitrides have demonstrated and continue to hold significant promise in a wide range of device technologies. This family of semiconductors has a tunable direct bandgap that ranges from 0.8 eV up to 6.2 eV, covering the IR, visible, and UV portions of the electomagnetic spectrum making them well suited to optoelectronic applications from visible light emitters to UV lasers and detectors. It is this application area that has received the most commercial attention to date, resulting in billion dollar LED industries. Perhaps the largest promise from wide bandgap semiconductor nitrides is yet to be fulfilled, that being in high frequency and high power electronics. The high breakdown fields and moderate-to-high electron mobilities in these materials make them ideal for GHz transistors and high voltage/high current power handling devices. Both areas are of critical need to future systems, such as wide bandwidth communications and control, and the all-electric ship.

Despite this considerable promise, a fundamental hurdle has limited progress in realizing some of these device technologies. That hurdle is a lack of native substrate that would permit homoepitaxy. Instead, wide bandgap semiconductor nitride films are grown heteroepitaxially on sapphire, silicon carbide, or other substrates. The lattice parameter and thermal coefficient of expansion difference between host substrate and nitride thin film result in the creation of stress and stress-relieving dislocations. These dislocations, or extended defects, propagate vertically in the film and can provide a vertical leakage path through layers grown for device applications. Further, these and related defects result in compensated films that make it difficult to controllably dope the material at low levels consistent with blocking layers in high power devices.

These challenges have stimulated research in novel methods of growing the material to reduce or eliminate the extended defects. These defect reduction efforts can be categorized into two techniques: epitaxial lateral overgrowth and growth on etch delineated surfaces. Epitaxial lateral overgrowth involves the masking of a continuous III-V nitride surface with either a silicon dioxide or a silicon nitride mask, growing up through the openings and then laterally over the masked area. Low defect material for devices is found in the wings that grow over the masked area; hence devices must be placed in these select areas. Growth on etched substrate surfaces of sapphire and silicon carbide, inter alia, has also been used to reduce stress and extended defect densities. In this technique as well, only a small fraction of the grown material is useful and available for device fabrication. In both cases, the height variation of the wafer surface becomes considerable and it is necessary to fabricate devices on top of this topography, a challenge for any lithographic process. Such approaches are not suitable for large area power devices and are inefficient for any integrated device manufacturing technology.

OBJECTS AND BRIEF SUMMARY OF THE INVENTION

An object of this invention is a method for making electronic devices characterized by a low reverse bias leakage current and significantly reduced extended defect densities.

Another object of this invention is growing electronic devices in fewer steps.

Another object of this invention is fabrication of electronic devices in absence of an etching step involving the active material.

Another object of this invention is fabrication of vertically conducting electronic devices with controlled growth rate and a means to reduce extended defect density.

Another object of this invention is to pattern a mask material by creating openings that extend to the substrate during fabrication of an electronic device and growing material in the openings.

Another object of this invention is a way to enhance thickness of active material without causing cracking therein.

These and other objects of this invention can be attained by depositing a mask material on a substrate; patterning the mask material to form openings in the mask material extending down to the clean substrate; cleaning the substrate; growing active material in the openings thus availing of confined growth; and stripping the mask material from the substrate to form an electronic device with low reverse bias leakage current and reduced extended defect density.

DETAILED DESCRIPTION OF THE INVENTION

The invention disclosed herein pertains to an electronic device and to a method for making it with substantially reduced extended defect densities in the active region of the device through the use of patterned and confined growth. Furthermore, the disclosed technique is highly amenable to the fabrication of arrays of such devices, as might be important in the formation of UV imaging systems, light emitting diode or laser arrays, or power diodes. As the fabrication steps are compatible with the formation of integrated devices, heterogeneous integration is possible thus enabling "smart power" systems with integrated control electronics and ultra-high speed computing electronics with integrated optical interconnects. Smart power systems are power systems where their operation, maintenance and regulation are controlled automatically. As used herein, the term "defect" pertains to an extended defect in crystallographic structure of a material.

More particularly, this invention pertains to an electronic device, which may be vertically or horizontally conducting, and to a fabrication method for making the electronic device that is characterized by confined epitaxy of active material resulting in a low dislocation density that results in low reverse bias leakage current. Since leakage current is related to extended defect or dislocation density, reduction in defect density results in a desired reduction of leakage current. As used herein, the term "active material" refers to that portion of the device structure where current flow is controlled.

Figure 1:
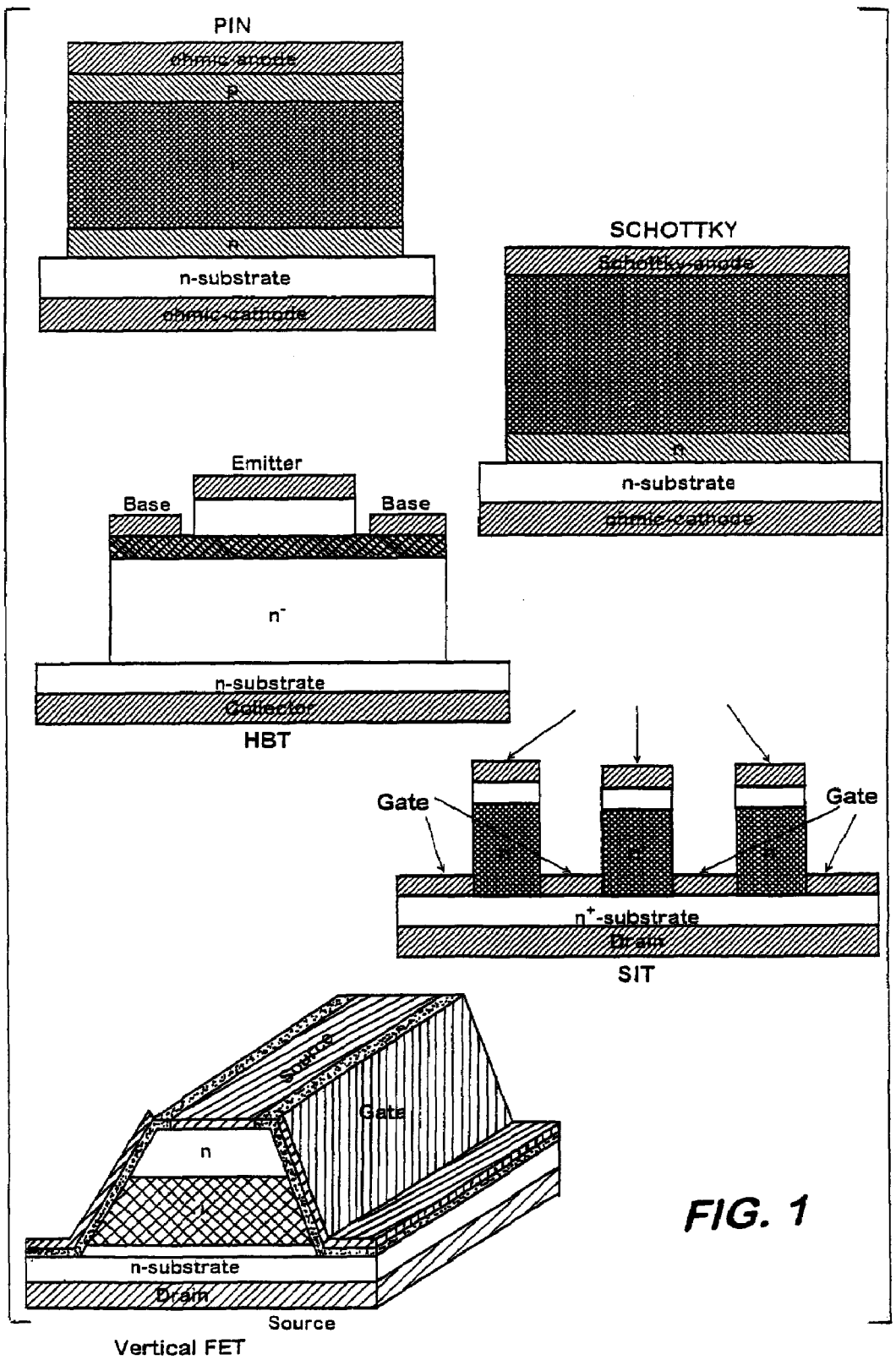
FIG. 1 is a schematic illustration of some electronic devices that can be positively impacted by this invention.

The fabrication method is characterized by the steps of depositing a mask material on a substrate; patterning the mask material to form openings in the mask material and thus expose the substrate; cleaning the exposed substrate to render it "epi-ready"; growing in the openings p-type, n-type, and/or undoped layers of the active material; stripping the mask material from the substrate; and depositing electrical contacts using usual contact procedures. The patterning step is carried out to form holes or spaces in the mask material that extend down to the top surface of the substrate within which the electrical device is grown. The resulting electronic device has a lower dislocation density and a lower reverse bias leakage current. The lower leakage current is a prerequisite for high voltage/current power handling devices, particularly vertically conducting electronic devices, such as pn and pin diodes, thyristors (not illustrated in FIG. 1), heterogeneous bipolar transistors (HBT), static induction transistors (SIT), and vertical field effect transistors (VFET), illustrated in FIG. 1.

General outline of one embodiment of the fabrication method of the electronic device is outlined in FIG. 2. The first step, shown in FIG. 2(a), involves the deposition of a mask material 12 on the substrate 14 of interest. The substrates typically are square, rectangular or circular, although they can be of any desired shape. The substrates are typically about 5 cm in diameter and at least about 330 µm thick. The substrates can be sapphire, diamond, silicon carbide, gallium nitride, or any other material, including but not limited to lithium aluminate, gallium arsenide, lithium gallate, and silicon. Typically, the substrate is either sapphire or silicon carbide.

One can deposit a several micron thick nitride layer, such as gallium nitride, on a substrate as a starting layer to allow for homoepitaxial growth before depositing the mask material. When depositing gallium nitride starting layer on silicon carbide substrate, mismatch in lattice parameters is 4% and when depositing gallium nitride on a sapphire substrate, the lattice mismatch is 14%. Deposition of the starting layer on a suitable substrate is made by metalorganic chemical vapor deposition to a thickness of about 3 microns, or by any other suitable technique to any desired thickness. When gallium nitride (GaN) is the starting layer and the substrate is sapphire, the gallium nitride precursors may be trimethylgallium and ammonia or any other suitable precursor. The starting layer is not separately identified in FIGS. 2(a)-2(d).

It should be understood that the starting layer is not a requirement. The mask material can be deposited directly on the bare substrate, with similar expected results.

The mask material can be deposited on the substrate in any manner desired. Growth of mask material using atmospheric pressure oxides and sputtered oxides can be used, as well as other known techniques. The mask material layer should be continuous and sufficiently dense so as not to allow nucleation through pin holes. Key issues in the selection of a mask material is its ability to remain stable at epitaxial growth temperature which eliminates all resists, its chemical inertness to the growth precursors so that the precursors do not stick or react with the mask material, and for it to be chemically different from the growth material to allow selective wet chemical etch.

Figure 2A:
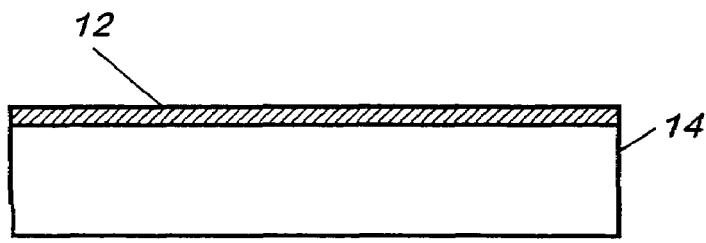
FIG. 2 is a schematic flow diagram of the patterned growth process of this invention, which includes FIGS. 2(a) to 2(d).
Figure 2B:
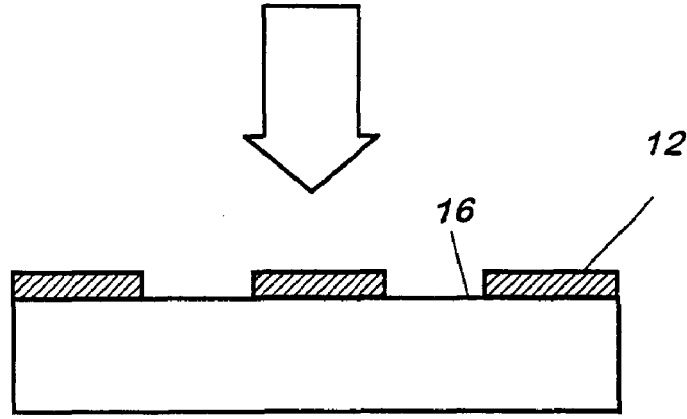

The substrate is coated with a starting layer, such as gallium nitride, and the mask material, such as silicon dioxide, is then deposited and patterned, as shown in FIG. 2(b), creating openings 16 in the mask material. The patterning procedure involves coating the deposited mask material with a thin layer of several hundred angstroms thick of an electron or photon sensitive resist, such as polymethylmethacrylate, which is processed using standard lithographic techniques to leave resist only in areas that will not ultimately be grown upon. This sequence of steps is used if subtractive etch of the mask material is to be employed; however, if lift-off procedure is to be used, then the resist material is deposited before the mask material.

The cleaning step, which is used to clean exposed substrate surfaces in the openings, involves immersion of a patterned sample in a cleaning solution for a sufficient time to remove organic and inorganic contaminants. Cleaning solution can be a dilute, about 10-20% by volume, aqueous sulfuric acid solution. A clean surface is obtained when it is possible to see no debris with an optical microscope and to see atomic or crystallographic steps or ledges in the substrate using an atomic force microscope.

The amount of open area on a substrate is important and should be adhered to since benefits of this invention are obtained when growth of the active material is done in a confined space. Open area, for purposes herein, is defined as a percentage of holes or open area devoid of any resist or mask material to total area of the substrate. When open area is between what is believed to be the approximate limits of 1% and 99%, growth of the active material with reduced defect density resulting in an electronic device with reduced reverse bias leakage current can be attained.

Figure 2C:
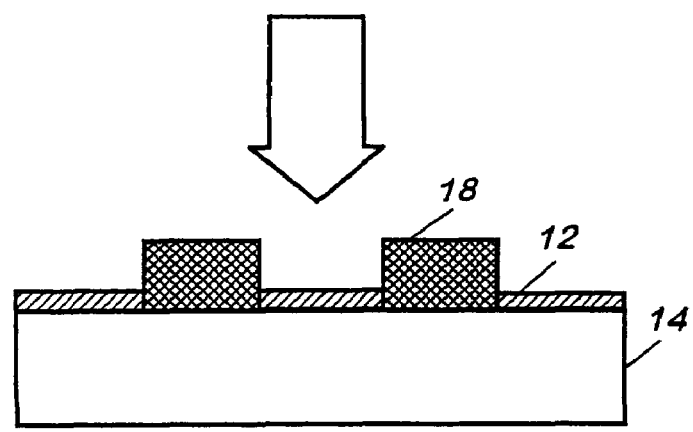

After cleaning the substrate surface or the starting layer, the sample can be again cleaned in a conventional way using standard solvent series ultrasonic technique immediately before placed into growth reactor to grow the active material 18 shown in FIG. 2(c). Growth of the active material, such as gallium nitride, is done in a reactor by epitaxial growth.

Prior to growing the active material in the reactor, the reactor is evacuated in controlled fashion. Temperature is then slowly ramped up to the growth temperature in a mixture of ammonia and hydrogen. When growing gallium nitride from the precursor trimethylgallium or any other suitable gallium-containing precursor, growth temperature is 1025° C. +/−25 and pressure is about 150 Torr although a much wider range of temperature and pressure is possible. The growth should be maintained at a reasonable rate for reduction of defects. Typical growth rate is about 1 µm/hr and should be maintained below about 100 µm/hr in order to reduce the defects in conformity with objectives of this invention, although higher rates are possible. The open area and growth rate are interdependent in this respect and should be maintained within the approximate ranges, given above, for the purpose of reducing defect density.

Once growth temperature is stabilized, flow of the gallium nitride precursor trimethyl gallium, or any other suitable gallium precursor, is introduced to commence the selective growth of gallium nitride in the holes or openings. After about 5 minutes, the trimethylgallium precursor is shut off and temperature of the sample is ramped down to room temperature in a mixture of ammonia, or any other suitable nitrogen source, and hydrogen or other suitable inert gas with or without hydrogen. After the sample reaches room temperature, the reactor chamber is opened and the sample is removed.

Figure 2D:
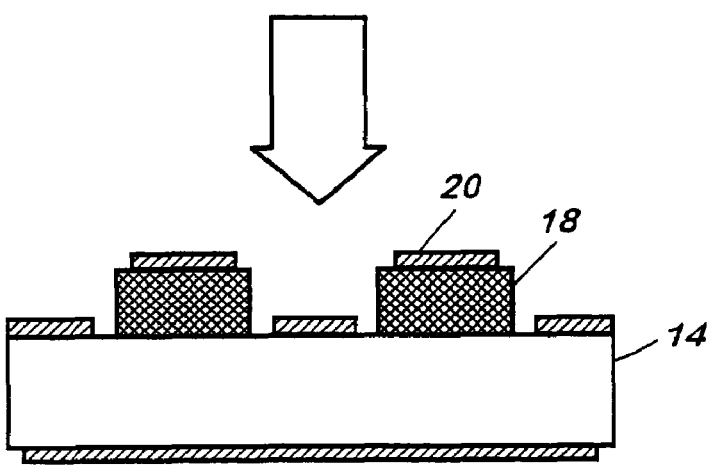

After attaining the desired growth in the reactor and reaching room temperature, the sample is removed from the reactor and the mask material remaining on the substrate is conventionally removed in the manner disclosed above. The sample can then be probed electrically for diode performance evaluation or subjected to additional steps for passivation and ohmic contact metalization. In this connection, FIG. 2(d) illustrates four electrical contacts 20 on substrate. The electrical contacts 20 can be of any suitable material, or a mixture thereof; however, nickel-gold, particularly 200 A thick nickel and 1500 A thick gold, are suitable.

Another embodiment of the fabrication method involves the use of the lift-off procedure of removal of the resist and the mask material. This other embodiment differs from the earlier embodiment only in the way certain materials are removed from the substrate. In the earlier embodiment, removal is accomplished with subtractive etching whereas here, it is done by the lift-off procedure. In this embodiment, characterized by the lift-off procedure, the substrate is cleaned before any processing using standard solvent series which may include but is not limited to ultrasonic clean using trichloroethane, isopropanol and de-ionized water. The substrate is then coated with a resist material which is processed using standard lithographic techniques to leave the resist only in areas that will ultimately be grown upon. This is followed by a blanket uniform coating of the dielectric thin film mask material deposited over the entire substrate covering the resist material using, e.g., atmospheric pressure chemical vapor deposition or reactive sputtering. The sample is then subjected to an acetone bath, or another suitable conventional bath, which causes the photoresist to dissolve and to remove the dielectric thin film mask on top of it leaving a patterned dielectric mask with openings extending to the substrate corresponding to growth areas.

The openings in the mask are further cleaned, as noted earlier, in a dilute 10%-20% by volume aqueous sulfuric acid solution. The patterned sample is then subjected to a solvent series cleaning procedure, already described, and loaded into the reactor for deposition of the active material in the openings, thus undergoing confined growth.

After confined epitaxy, the sample is immersed in a conventional buffered oxide etch for a few minutes to remove the mask material. Purpose of the mask is to provide for the confining growth of the active material.

Having described the invention, the following example is given as a particular embodiment thereof and to demonstrate the practice and advantages thereof. It is understood that the example is given by way of illustration and is not intended to limit specification or the claims in any manner.

EXAMPLE I

This example illustrates confined growth of an electronic device fabricated by the use of the lift-off procedure for removing resist and oxide mask materials in the growth areas.

Pursuant to the objectives herein, the substrate used was a sapphire disk 5 cm in diameter and 330-micron thick coated with a 3-micron thick layer of gallium nitride starting layer that was cleaned before any processing using a standard solvent series ultrasonic cleaning. The polymethylmethacrylate resist of several hundred angstroms thickness was spun on the substrate, and processed using standard lithographic techniques that left the resist only in areas that were ultimately to be grown upon. A blanket mask coating 1000 angstroms thick of the dielectric thin film silicon dioxide was uniformly deposited on the resist using reactive sputter deposition. The principal purpose of the mask material herein was to provide confined growth of the gallium nitride active material. The sample was then subjected to an acetone bath which caused the photoresist to dissolve and to remove the mask on top of the resist, thus leaving a patterned mask with openings in it. The openings of the mask were further cleaned in a dilute aqueous 10-20% by volume sulfuric acid solution. The patterned sample was then subjected to a solvent series cleaning procedure in an ultrasonic bath, as described in connection with cleaning of the substrate before being inserted into the growth reactor, and loaded into the metalorganic chemical vapor deposition chamber where gallium nitride semiconductor thin film was conventionally grown in the openings in the mask at a rate of about 1 μm/hr to a thickness of about 5000 A.

Growth of gallium nitride in the openings of the mask involved controlled evacuation of reactor and slow ramping of the temperature of the sample to the growth temperature of 1013° C. in a mixture of ammonia and hydrogen. Once growth temperature was stabilized, a flow of the gallium precursor trimethylgallium was introduced to commence the growth of gallium nitride in the openings. After 5 minutes of the growth, flow of trimethylgallium was shut off and temperature of the sample was ramped down to room temperature in the mixture of ammonia and hydrogen. After temperature of the sample reached room temperature, the chamber was opened and the sample removed. Removal of the dielectric mask material was completed by immersing the sample in a conventional buffered oxide etch for 5 minutes.

The sample was then probed electrically for diode performance evaluation which included establishing a contact on top of the confined growth and a contact on the substrate, then applying a voltage between the contacts while measuring the current flow.

Figure 3:
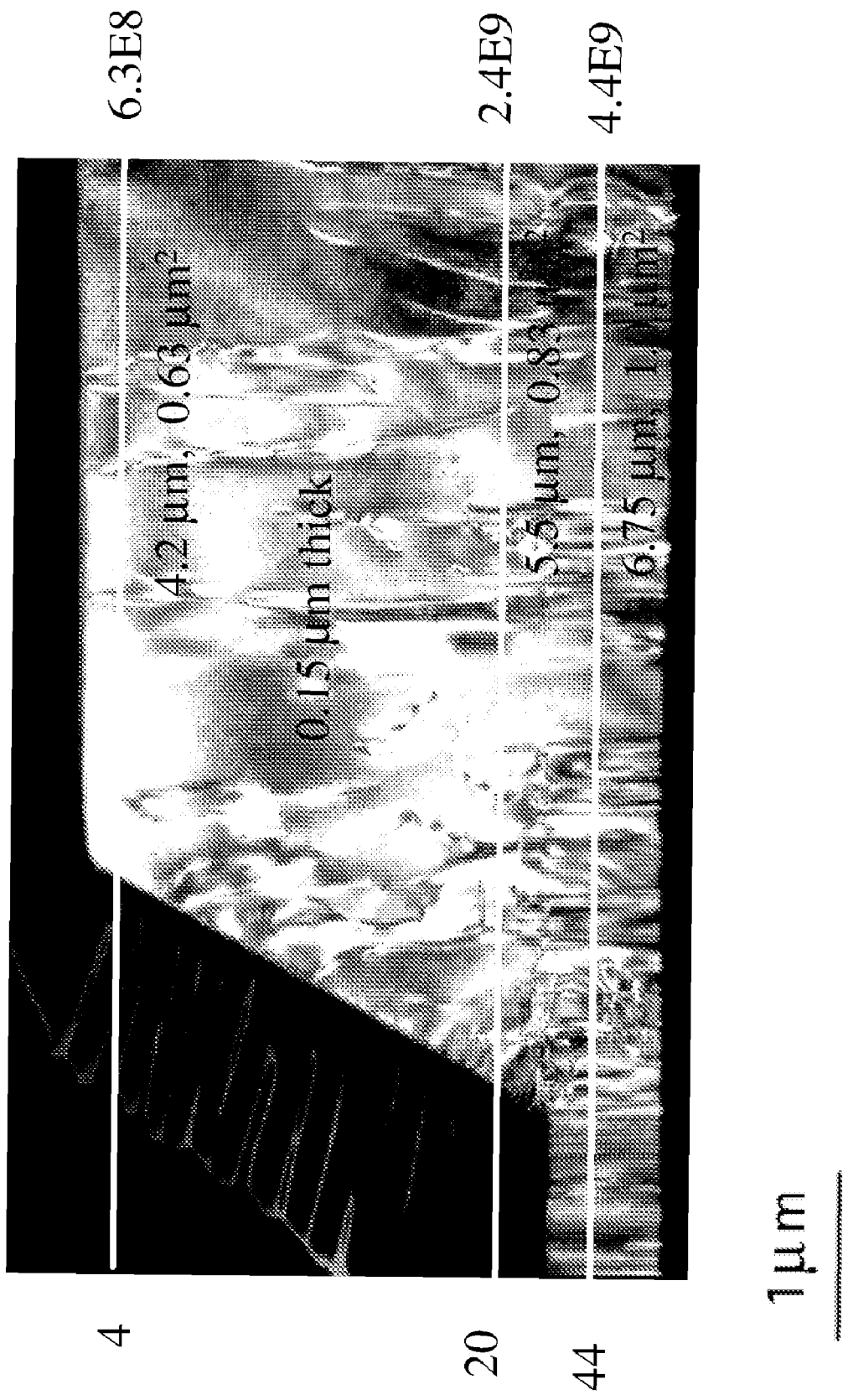
FIG. 3 is a transmission electron micrograph of an electronic device fabricated pursuant to the invention herein illustrating the reduction of dislocation density in the patterned growth region.
Figure 4:
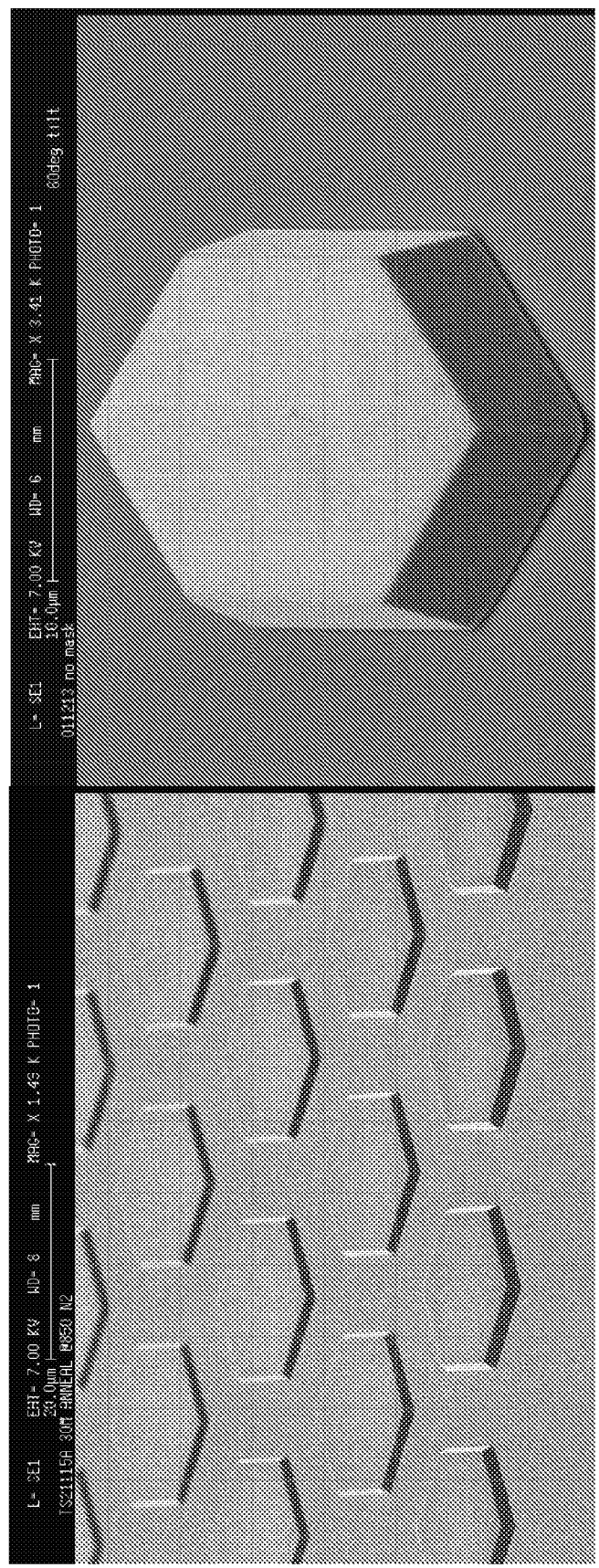
FIG. 4 illustrates scanning electron micrographs of patterned growth mesas with atomically smooth sidewall facets.
Figure 5:
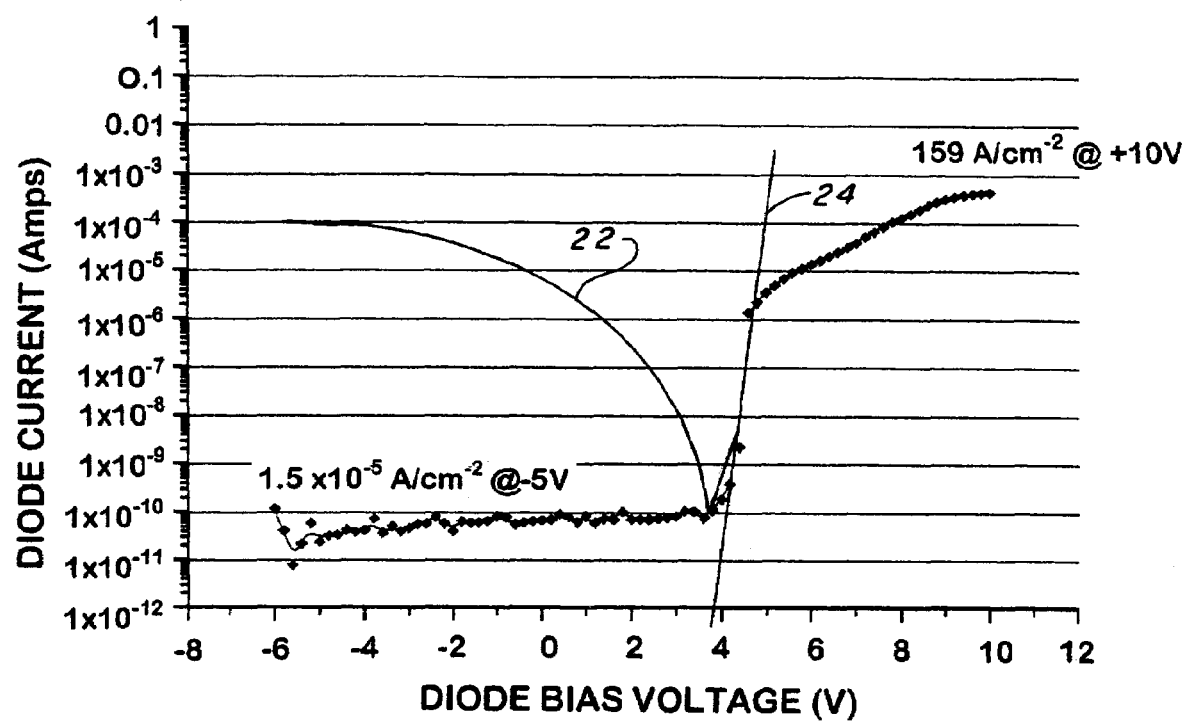
FIG. 5 is a plot of Diode Current against Diode Bias Voltage showing low reverse bias leakage current of an unpassivated diode fabricated pursuant to the invention herein as compared to leakage current of a diode fabricated pursuant to a typical prior art fabrication procedure.

The fabricated sample, as described above, had a reduced defect density on the order of one magnitude, as verified by the transmission electron micrograph of FIG. 3 and a reduced leakage current, as shown in the graph of FIG. 5. The sample also had atomically ($\leq$10 A) smooth side surfaces as shown in FIG. 4 where the left scanning electron micrograph is a 1400× magnification of the growth mesas and the right micrograph of FIG. 4 is a 3400× magnification of a growth mesa. FIG. 5 shows reverse bias leakage current below $1 \times 10^{-9}$ amps, which is a great deal below that of the prior art depicted by curve 22. In FIG. 5, curve 24 denotes the turn-on voltage for such devices. The smooth mesa surfaces shown in FIG. 4 facilitate passivation, reduce electron scattering, and contribute to stability of the grown active material.

It is an important advantage that the surfaces created by the fabrication method disclosed herein are atomically flat (less than 10 A). Such surfaces are shown in the scanning electron micrographs of FIG. 4. Flatness of the surfaces enhances the effectiveness of passivation coatings via better bonding arrangements and is critical to the creation of high efficiency light emitting and laser diodes with edge emission.

The measured current-voltage characteristics of pn junction diodes created using the novel method are illustrated in FIG. 5 and elsewhere. It should be noted that the reverse bias leakage current, which is likely to be most affected by the presence of extended defects, is extremely low. It should also be noted that the electronic device used to construct the plot of FIG. 5 was unpassivated such that surface leakage currents could contribute to the measurement.

The reduction in strain achieved by the method disclosed herein results in reduced extended defect densities, as already noted. These extended defects have a deleterious effect on doping efficiency and the thickness of layers that can be achieved before cracking. By rapidly reducing the number of the defects, resulting films have a lower background doping concentration that leads to more controllable and efficient doping. The thicker films also permit large blocking layers required for high voltage power devices. For instance, a thickness of about 35 μm of the active material is required to block 6 KV.

Electronic devices, fabricated as described above, are useful in ultra high frequency operation of 1-100 GHz at high power density of 2-10 W/mm of gate periphery. For high voltage blocking devices, all of which have leakage current, a specific example of the benefit provided by the invention herein is for increased blocking capacity.

The samples made in conformance with confining growth, as described above, can be subjected to an additional step of conventional passivation or growth of an oxide or another layer on the surface of the grown gallium nitride to provide electrical stability by isolating the transistor surface from electrical and chemical conditions in the environment. Passivation reduces reverse current leakage, increases breakdown voltage, and enhances power dissipation rating. A silicon nitride film of 500 A typically provides the intended passivation but other materials and thicknesses may be suitable.

The samples made in the manner disclosed herein are at some point subjected to ohmic contact metalization, which is carried out in a conventional manner. In this respect, electrical contacts consisting of a layer of 200 A of nickel and a layer of 1500 A of gold thereon have been found to provide the desired contact.

While presently preferred embodiments have been shown of the novel electronic device and fabrication method therefor, and of the several modifications discussed, persons skilled in this art will readily appreciate that various additional changes and modifications may be made without departing from the spirit of the invention as defined and differentiated by the following claims.

What is claimed:

1. A device having reduced extended defect density comprising:
    a substrate;
    a semiconductor active material deposited on the substrate, wherein the semiconductor active material defines raised structures having atomically smooth surfaces of about 10 Angstroms high; and
    electrical contacts,
    wherein the raised structures are confined to a sufficiently small space and the raised structures have a sufficiently low extended defect density measured by the device having a reverse bias leakage below $1\times10^{-9}$ amps.

2. The device of claim 1, wherein the substrate is selected from the group consisting of sapphire, diamond, silicon carbide, lithium aluminate, lithium gallate, and silicon.

3. The device of claim 2, wherein the semiconductor active material is selected from the group consisting of nitrides that have a tunable direct bandgap in the approximate range of 0.8 eV to 6.2 eV.

4. The device of claim 1, wherein the semiconductor active material is selected from the group consisting of nitrides that have a tunable direct bandgap in the approximate range of 0.8 eV to 6.2 eV.

5. The device of claim 1, wherein the semiconductor active material is selected from the group consisting of gallium nitride, aluminum gallium nitride and indium gallium nitride.

6. The device of claim 1, wherein the device operates at a frequency in the approximate range of 1 GHz to 100 GHz and at a power in the approximate range of 2 W/mm of gate periphery to 10 W/mm of gate periphery.

7. The device of claim 6, wherein the substrate is selected from the group consisting of sapphire and silicon carbide and the active material is selected from the group consisting of gallium nitride, aluminum gallium nitride and indium gallium nitride.

8. The device of claim 1, wherein the raised structures are confined to an area less than about 20 μm across and wherein the device has a low-defect vertical conduction path through the substrate.

9. The device of claim 2, wherein the substrate is selected from the group consisting of sapphire and silicon carbide and said active material is selected from the group consisting of gallium nitride, aluminum gallium nitride and indium gallium nitride.

10. The device of claim 9, wherein the electrical contacts are selected from suitable metallic materials.

11. The device of claim 1, wherein the electrical contacts are selected from suitable metallic materials.

12. The device of claim 1, wherein the electrical contacts include a nickel layer and a gold layer.

13. The device of claim 1, wherein the device is a vertically conducting device.

14. The device of claim 1, wherein the device is one selected from the group consisting of pn and pin diodes, thyristors, heterogeneous bipolar transistors (HBT), static induction transistors (SIT) and vertical field effect transisitors (VFET).

15. The device of claim 1, wherein the substrate has a surface area on which the semiconductor active material is deposited, wherein the semiconductor active material is deposited in confined areas covering 1% to 99% of the substrate surface area.

16. The device of claim 1 further comprising a layer of passivation the semiconductor active material isolating the semiconductor active material from electrical and chemical conditions in the environment.

17. The device of claim 1, wherein the device operates at a frequency in of less than 100 GHz.

18. A device having reduced extended defect density comprising:
    a substrate;
    a semiconductor active material deposited on the substrate, wherein the semiconductor active material defines raised structures having atomically smooth surfaces and wherein the raised structures are confined to an area less than about 20 μm across and about 10 Angstroms high; and
    electrical contacts,
    wherein the raised structures have a sufficiently low extended defect density measured by the device having a reverse bias leakage below $1\times10^{-9}$ amps and wherein the device has a low-defect vertical conduction path through the substrate.

* * * * *